SYMMETRICAL WAVEFORM RATE-OF-RISE CLIPPER AMPLIFIER

Filed July 11, 1966

INVENTORS.
ROBERT K. DAVIS and
FOSTER B. NOLLEY
BY H. H. Losche
Attorney 3,500,067
SYMMETRICAL WAVEFORM RATE-OF-RISE CLIPPER AMPLIFIER Robert K. Davis and Foster B. Nolley, Indianapolis, Ind., assignors to the United States of America as represented by the Secretary of the Navy Filed July 11, 1966, Ser. No. 564,452
Int. Cl. H03k *5/08*
U.S. Cl. 307—237 1 Claim

ABSTRACT OF THE DISCLOSURE

A symmetrical waveform rate-of-rise clipper class A amplifier having a pair of collector-to-base coupled transistors, the second in the series being in emitter follower output with a feedback through reversely oriented diodes to the base input of the first in the series of transistors. The input to the base electrode of the first in the series of transistors is through an isolation means, such as a resistor or amplifier, and this base electrode is stabilized in voltage bias from a voltage divider circuit to minimize amplifier output jitter and to insure fast rise rate for short rise time of the output signals.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to clipper amplifiers and more particularly to transistor, Class A amplifiers having diode clipper negative feed back and voltage divider transistor control electrode bias to produce fast voltage symmetrical waveform rise and fall leading and trailing edges without time jitter with respect to input signals.

A bistable multivibrator is sometimes used for converting a sine wave or other nonsquare wave into a more nearly square waveform. The principal disadvantage is that the multivibrator does not trigger at the same instantaneous voltage level in each cycle with the result that there is an unavoidable and undesirable time jitter from one cycle from one cycle to the next. This is especially true when the input waveform is a sine wave and is worse when the input waveform is a triangular wave of the same frequency and peak-to-peak amplitude. Avalanche diodes or conventional diodes, with or without batteries or other reference voltage sources, are sometimes used as signal clippers. One known means of generating a square wave from a sine wave is shown in FIGURE 1 in which silicon diodes are used in opposed polarity relation in negative feedback to limit the output signal. One limitation of the circuit is that the voltage gain tends to be low either because of low input impedance or because of emitter degeneration if resistor 13 were left unbypassed to increase the input impedance. Another limitation is that the feedback is coupled back from a high impedance (collector load resistor) through a capacitor and the reversely oriented biodes to the summing point. The net result of both limitations is poor time jitter characteristics. The feedback should be taken from a low impedance point.

SUMMARY OF THE INVENTION

In the present invention a pair of transistors are used in which the first is an inverting amplifier and the second is an emitter follower. The input signal is applied to the base of the first transistor and the amplified output is taken from the emitter electrode of the second transistor.

The base of the first transistor is biased from a voltage divider coupled to a supply voltage for the circuit thus avoiding signal feedback which lowers the input impedance and hence the voltage gain. A negative feedback path for the signal is through a parallel combination of oppositely poled diodes connected in series with a capacitor to block D.C. voltage. It is therefore a general object of this invention to provide an amplifier that has sufficient gain and is stabilized for good linearity to minimize time jitter and to produce symmetrical waveforms of fast rate of rise and fall.

BRIEF DESCRIPTION OF THE DRAWING

These and other objects and the attendant advantages, features, and uses will become more apparent to those skilled in the art as a more detailed description proceeds when considered along with the accompany drawing in which:

FIGURES 2(*a*), 2(*b*), and 2(*c*) illustrate slight modifications of the voltage divider circuit for the base bias on the amplifier of FIGURE 2.

DESCRIPTION OF THE PREFERRED EMBODIMENTS

Figure 1:
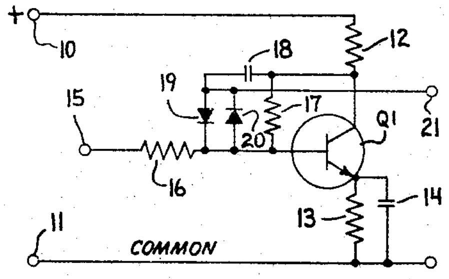
Fig. 1. (Prior Art)
FIGURE 1 is a circuit schematic of an amplifier for developing square waves from sine wave signals, representing the prior art.

Referring more particularly to FIGURE 1 illustrating the prior art, a single stage of amplification utilizing a transistor Q1 is supplied direct current (D.C.) voltage from terminals 10 and 11 in the proper polarity for the type of transistor used. In this illustration an NPN transistor is shown in which the positive terminal of the D.C. source supplies collector voltage through a collector load resistor 12 and the emitter is coupled to the opposite pole or common lead through the emitter load resistor 13. A capacitor 14 is coupled in parallel to the resistor 13. The base of transistor Q1 has a signal input at terminal 15 through an isolating resistor 16, this base being biased from the positive source 10 through the resistor 12 and a resistor 17. A feedback circuit from the collector to base is by way of a capacitor 18 in series with a parallel coupled pair of reversely oriented diodes 19 and 20. The diodes 19 and 20 limit the signal on output 21 to approximately 1.2 volts peak-to-peak, if diodes are silicon. One limitation of this circuit is the low gain which results in undesirable time jitter. Another limitation is that the feedback is coupled back from a high impedance such as resistor 12 through the capacitor 18 and the diodes 19 and 20 to the summing point. The net result of both limitations is poor time jitter characteristics. The output signal at 21 is alternately fed from a high and low impedance depending on the conduction state of the diodes 19 and 20.

Figure 2:
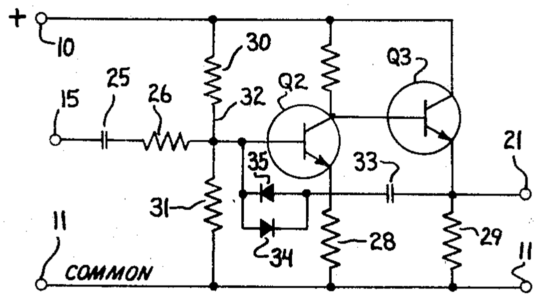
FIGURE 2 is a circuit schematic diagram of a symmetrical waveform rate of rise amplifier showing a preferred form of this invention.
Figure 2A:
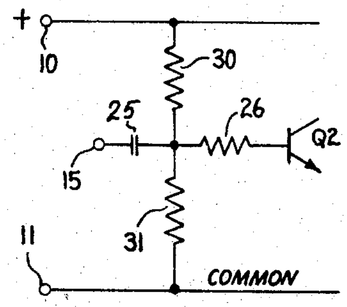
Figure 2B:
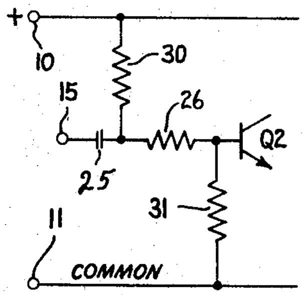
Figure 2C:
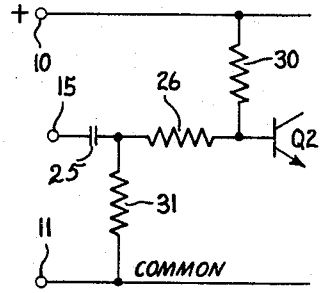

Referring more particularly to FIGURE 2 wherein like reference characters identify like parts as in FIGURE 1, there is shown in circuit schematic a symmetrical waveform rate of rise amplifier utilizing two transistors Q2 and Q3. While either NPN or PNP type transistors may be utilized with proper polarity of voltage applied thereto, this figure illustrates the utilization of two NPN type transistors in which transistor Q2 is collector coupled to the base of transistor Q3 and the signal input 15 is coupled through a capacitor 25 and an isolating resistor 26 to the base of transistor Q2. The collector of transistor Q3 is directly coupled to the positive voltage supply source while the collector of transistor Q2 is coupled through a collector load resistor 27 to source 10. The emitters of transistors Q2 and Q3 are coupled, respectively, through emitter load resistors 28 and 29 to the voltage source terminal 11. Transistor Q2 accordingly operates as an inverting amplifier while transistor Q3 operates as an emitter follower amplifier.

The base of transistor Q2 is biased through a voltage divider circuit consisting of resistors 30 and 31 serially coupled across the voltage supply terminals 10 and 11 with the junction 32 summing point coupled directly to the base of transistor Q2. Resistors 30 and 31 may be of choice values to establish the desired fixed bias on the base of transistor Q2. The amplified output is taken from terminal 21 directly coupled to the emitter of the emitter follower transistor Q3 and this output is fed back through a capacitor 33 in series with parallel coupled diodes 34 and 35 to the base of transistor Q2, the diodes 34 and 35 being oriented in opposite directions to limit either polarity of the output voltages fed back to the base of transistor Q2 and to provide a low impedance path once the threshold of either diode is reached.

Resistor 26 is an isolating resistor which decouples the junction of the transistor Q2 base, the cathode of diode 35, and the anode of diode 34 from the signal source 15 in case the latter has a low output impedance, i.e., not high impedance compared to the emitter of transistor Q3. A low impedance at the junction 32 would cause undesired loading on the emitter of transistor Q3. Transistors Q2 and Q3 each preferably operate as approximately linear Class A amplifiers and such operation is preferred because voltage gain is higher, thus giving a faster rise rate for shorter rise time to each signal applied to input 15. Class A amplifier operation is preferred because current switching is significantly faster than saturated switching of transistors Q2 and Q3. Resistor 28 tends to stabilize the operating point of transistor Q2 by means of D.C. degeneration. This is desirable but not essential. Diodes 34 and 35, which may preferably be silicon diodes, each have a high resistance when the voltage across them is less than approximately 0.6 volt, either polarity. When the instantaneous alternating voltage exceeds approximately 0.6 of a volt, the diode which is forward biased will conduct. Transistor Q2 produces at its collector, and at the same time on the base of transistor Q3, an amplified and inverted approximate replica (except for shorter rise time) of the net signal appearing on the base of transistor Q2 from the input terminal 15. Transistor Q3 being an emitter follower amplifier, reproduces at the output point 21, the signal appearing at its base but at a much lower impedance level. The capacitors 25 and 33 will pass alternating current voltages but will block D.C. voltages.

The net instantaneous signal at the base of transistor Q2 is the signal received from the source 15 through capacitor 25 and resistor 26 less the feedback signal passed through capacitor 33 and diode 34 or 35 if one of them is conducting; i.e., when the net instantaneous A.C. voltage across the diodes exceeds approximately 0.6 volt in the forward direction. In this circuit the inverse voltage applied to either diode never exceeds approximately 0.6 volt because that is the voltage at which the other diode will conduct. When the net instantaneous voltage across the diodes 34 and 35 is less than approximately 0.6 volt, there is no feedback signal passed by the diodes and transistor Q2 amplifies the full signal from the input terminal 15. Thus the rate of rise (volts per second) and fall of the input signal from the source 15 is increased, or multiplied, approximately by the voltage gain of the transistor amplifier Q2. The output voltage of transistor Q3 is approximately 2×0.6 volt equal to 1.2 volts peak-to-peak because the feedback through the capacitor 33 and one of the diodes 34 or 35 reduces the net instantaneous signal at the base of transistor Q2 to nearly zero. The actual value is approximately the following:

$$\frac{1.2 \text{ volts}}{\text{gain of } Q3}$$

peak-to-peak. This follows conventional operation amplifier theory within the conduction range of the diodes.

Referring to FIGURES 2(*a*), 2(*b*), and 2(*c*), the voltage dividing resistors 30 and 31 of FIGURE 2 can be rearranged with respect to the isolating resistor 26 to provide further desirable selection of voltage division to establish unique bias voltage on the base of transistor Q2. As shown in FIGURE 2(*a*) the voltage divider resistances 30 and 31 can be in series and their junction coupled to the junction of capacitor 25 and resistor 26. Alternative means may be by coupling resistor 30 to the junction of capacitor 25 and resistor 26 and the resistor 31 to the base electrode of transistor Q2, as shown in FIGURE 2(*b*), or vice versa, as shown in FIGURE 2(*c*). While this means of arranging the three resistors for voltage division may be advantageous, the highest gain of the Q2 amplifier will probably be as shown in FIGURE 2.

OPERATION

In the operation of the device of FIGURE 2 let it be assumed that a sine wave is applied as the input signal at terminal 15. Since the voltage divider 30, 31 produces a constant biasing voltage at terminal point 32 on the base of transistor Q2 this transistor will amplify this signal by becoming conductive at the same point of each sine wave signal waveform since the bias voltage on its base does not vary. The dividing circuit 30, 31 provides one means of minimizing time jitter of the square voltage waves produced on the output 21. The output 21 taken from the emitter of transistor Q3 is of low impedance which produces a negative feedback through the capacitor 33 and either diode 34 or 35 to the base of transistor Q2. The diodes also produce a low forward resistance when conducting. Any appreciable impedance in the conducting path, whether in the diode itself or in the circuit which it is fed from, degrades the performance considerably. The voltage divider bias network 30, 31 permits freer choice of bias thus permitting greater linearity over the operating range. Good linearity helps to preserve symmetry of the input waveform. If the input waveform is a perfect symmetrical sine wave and nonsymmetry is not introduced by the circuit, there can be no time jitter. Accordingly, input sine wave signals applied to terminal 15 will produce symmetrical square waves on the output 21 with fast rise and fall leading and trailing edges, respectively. The same operation and similar results would be accomplished using any of the modifications of FIGURES 2(*a*), 2(*b*), or 2(*c*).

Figure 3:
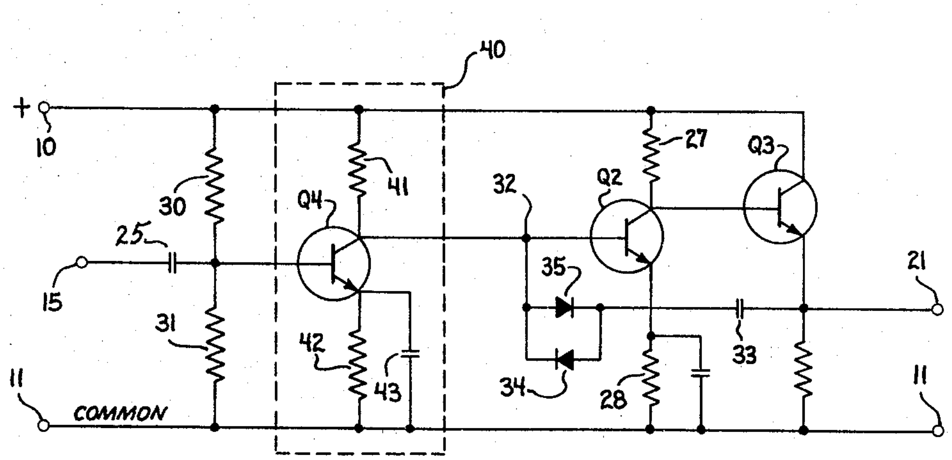
FIGURE 3 is a circuit schematic diagram illustrating a modification of the invention of FIGURE 2 by replacement of an isolating element of the prior figure.

Referring more particularly to FIGURE 3, where like reference characters are used the same as in FIGURE 2, there is shown a modification in which the isolating resistor 26 is replaced by a transistor amplifier Q4 shown within the dotted line area 40. This isolation amplifier Q4 is collector loaded by collector load resistor 41. The collector, which is the output of Q4, is coupled to the summing point terminal 32 of the symmetrical waveform rate of rise amplifier. The emitter of transistor Q4 is coupled through a parallel circuit of a resistor 42 and a capacitor 43 to the common lead terminal 11. Use of the collector loaded amplifier stage 40 provides a voltage gain to the signal, if so desired. Additional voltage gain permits clipping from an effectively higher signal voltage source thus further reducing the rise time of the input signal. This amplifier 40 will likewise decouple the junction 32 from the base of transistor Q2, the anode of diode 34, and the cathode of diode 35 from the low impedance signal source 15.

The operation of the circuit shown in FIGURE 3 is substantially the same as that disclosed for FIGURE 2 except that the isolating amplifier 40 may be used to amplify the input signal where desired. The circuits of FIGURE 2 and FIGURE 3 are superior to the prior art, illustrated in FIGURE 1 in both reduced rise time and reduced time jitter. These advantages are obtained from the increased voltage gain below the clipping level and from the low output impedance at the point in the circuit (output of emitter follower Q3) from which the feedback through the diodes is obtained. These are separate advantages but are related because the reduction of rise time helps to reduce the time jitter in the circuits of this invention.

While many modifications and changes may be made in the constructional details and features of this invention, as by utilizing PNP transistors with polarity changes or vacuum tubes, to accomplish the teaching of producing symmetrical waveforms with mast rate of rise and fall without departing from this invention, it is to be understood that we desire to be limited in the spirit of our invention only by the scope of the appended claims.

We claim:

1. A symmetrical waveform rate-of-rise clipper amplifier comprising:

a pair of transistors, each having collector and emitter conduction electrodes and a base electrode, one conduction electrode of one transistor coupled directly to the base electrode of the other transistor with a supply voltage coupled through load resistors to the emitter and collector conduction electrodes of said one transistor and with said voltage supply coupled directly to the collector electrode and through a load resistor to said emitter electrode of said other transistor, said base electrode of said one transistor constituting an input to said one transistor operating as an inverter amplifier and said emitter of said other transistor constituting an emitter follower output;

a signal isolation element in series in said input to said inverter;

a voltage dividing circuit consisting of two resistors having one terminal of each coupled across said supply voltage and the other terminal of each coupled to said isolation element and to said input to provide constant voltage bias on said base electrode of said one transistor to stabilize the voltage level at which conduction of the inverter starts and stops; and a feedback circuit from said output to said input having a pair of parallel coupled diodes with low resistance above a predetermined value, said parallel coupled diodes being in series with a capacitor to provide a fast rise and fall of leading and trailing edges on the output of said inverter with clipped feedback of either polarity whereby alternating signals applied to said input are amplified at full signal strength until clipped by said diode feedback to produce fast rise and fall leading and trailing edges at the precise time established by said stabilized voltage level on said inverter to prevent jitter of the emitter-follower output which output signals are limited in amplitude by said feedback circuit.

References Cited

UNITED STATES PATENTS

| | | | |
|---|---|---|---|
| 3,162,818 | 12/1964 | Murphy | 307—237 XR |
| 3,223,936 | 12/1965 | Cook | 330—19 |
| 3,198,961 | 8/1965 | Millsap | 307—264 X |

FOREIGN PATENTS

| | | |
|---|---|---|
| 1,116,650 | 2/1956 | France. |

OTHER REFERENCES

Pub. I, "Nonsaturating Inverting Amplifier" by Atkins in IBM Technical Disclosures Bulletin, vol. 7, No. 7, December 1964, pp. 596 and 597.

DONALD D. FORRER, Primary Examiner

STANLEY D. MILLER, Assistant Examiner

U.S. Cl. X.R.

307—261, 268; 328—31, 171, 175; 330—28, 29, 110